United States Patent [19]

Baba

[11] Patent Number: 4,596,001

[45] Date of Patent: Jun. 17, 1986

[54] BLOCK-DIVIDED SEMICONDUCTOR MEMORY DEVICE

[75] Inventor: Fumio Baba, Kawasaki, Japan

[73] Assignee: Fujitsu Limited, Kawasaki, Japan

[21] Appl. No.: 556,549

[22] Filed: Nov. 30, 1983

[30] Foreign Application Priority Data

Dec. 4, 1982 [JP] Japan .............................. 57-212085

[51] Int. Cl.$^4$ .......................................... G11C 13/00
[52] U.S. Cl. .................................... 365/189; 365/221; 365/230
[58] Field of Search .................. 365/189, 221, 230

[56] References Cited

U.S. PATENT DOCUMENTS 4,330,852  5/1982  Redwine et al. .................... 365/221

Primary Examiner—Terrell W. Fears
Attorney, Agent, or Firm—Staas & Halsey

[57] ABSTRACT

In a semiconductor memory device, memory cells (1-1 to 1-4, 1'-1, 1'-2) are divided into a plurality of blocks ($BK_1$, $BK_2$) in which a plurality of pairs of sense lines ($S_1$, $\overline{S}_1$, ..., $S_4$, $\overline{S}_4$) are provided. The sense lines are commonly connected to each other, i.e., the sense lines of one block ($BK_1$) are connected to the respective sense lines of the other block ($BK_2$). The sense relationship between two adjacent sense lines ($S_1$, $S_2$) belonging to one block ($BK_1$) is opposite to the sense relationship between the corresponding two adjacent sense lines ($S_1$, $\overline{S}_2$) belonging to the other block ($BK_2$).

5 Claims, 14 Drawing Figures

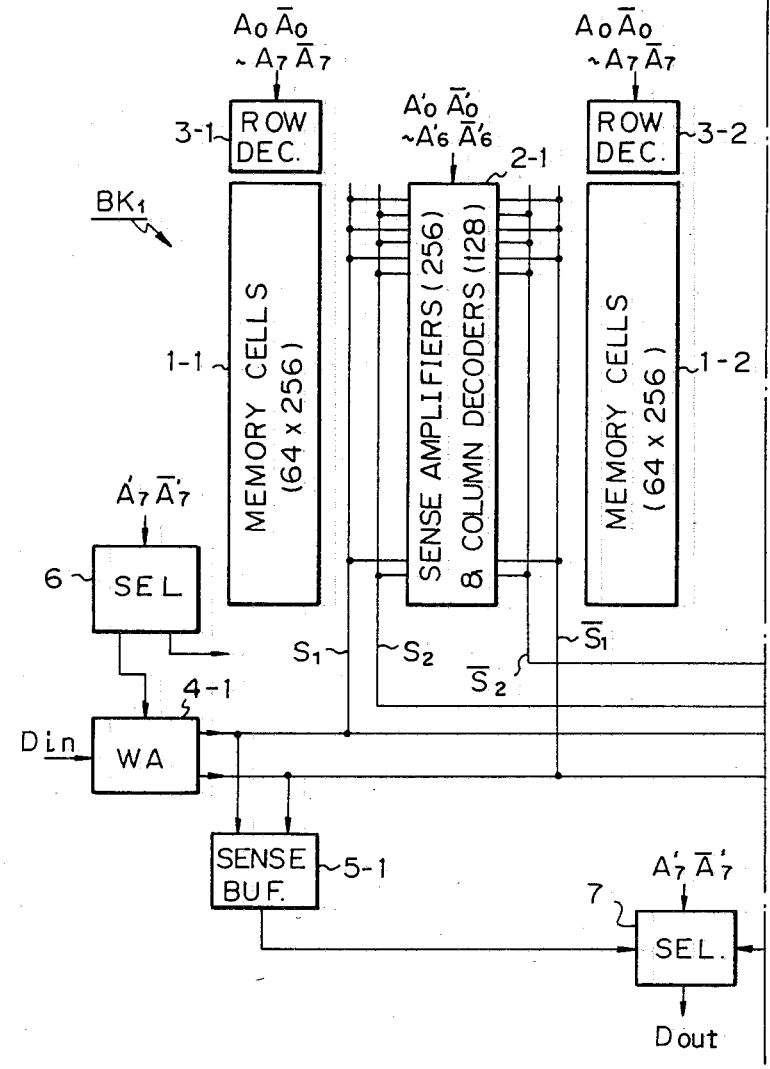

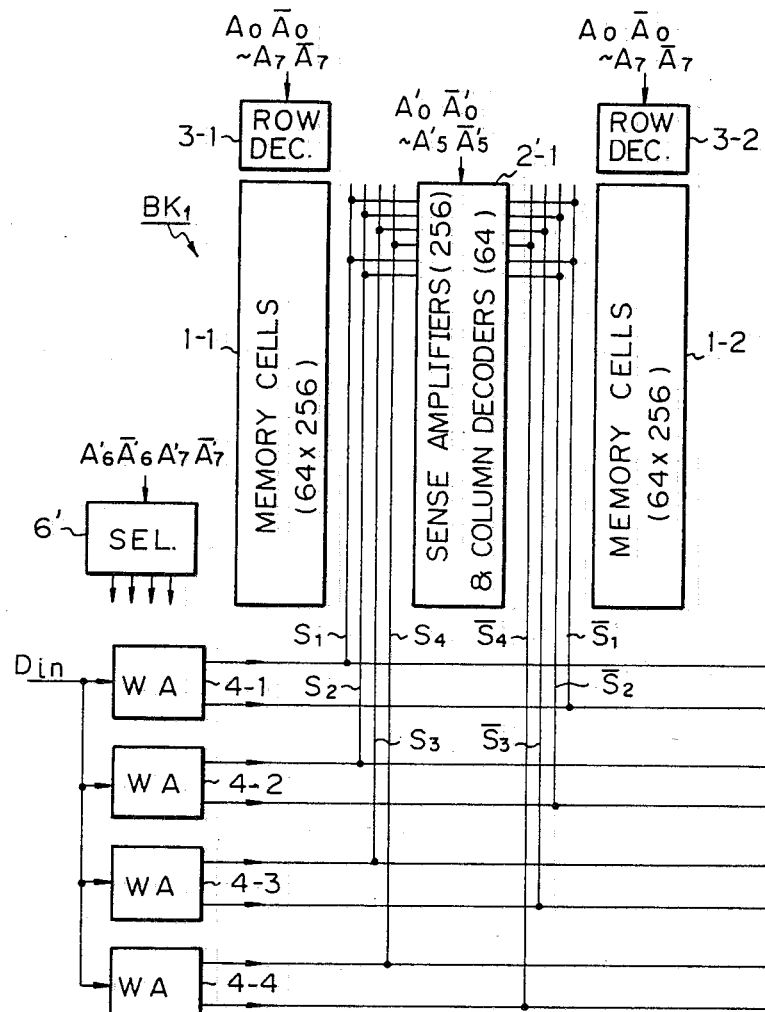

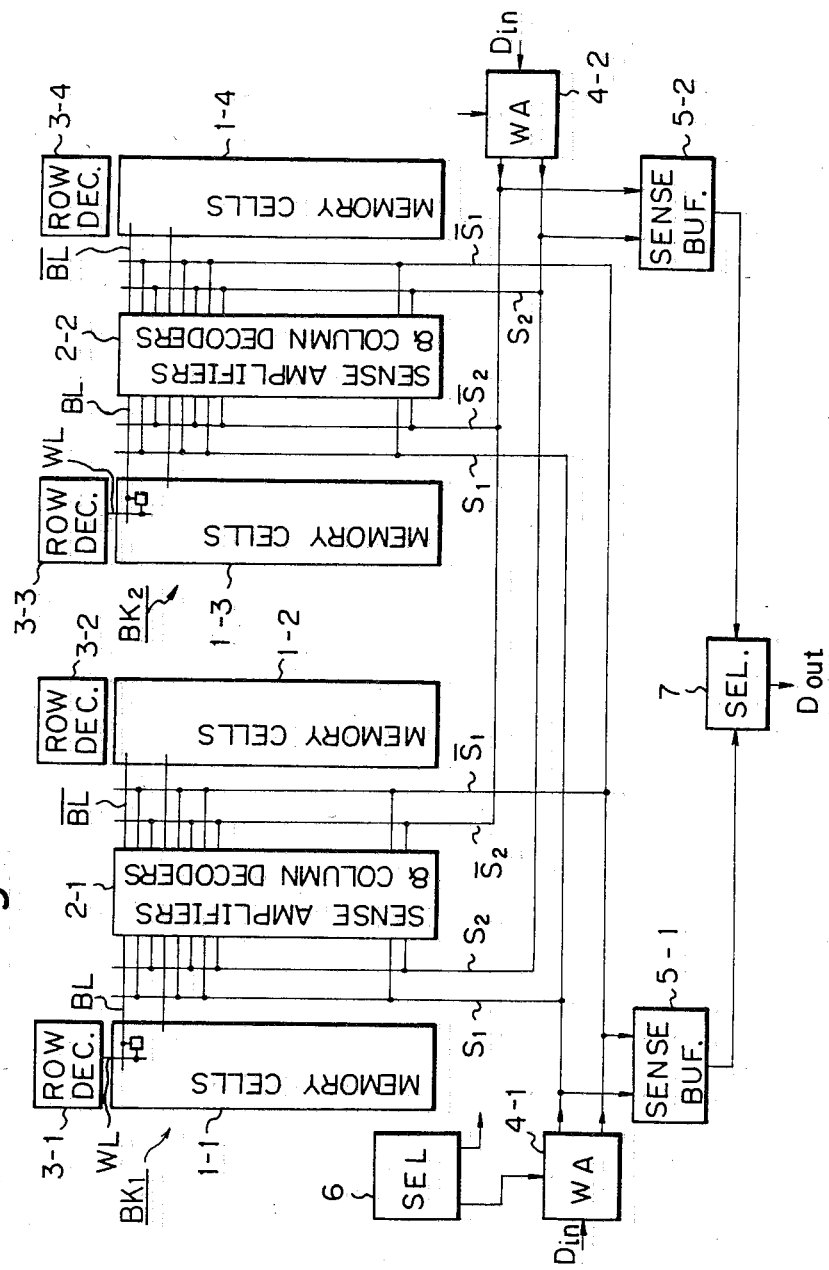

BLOCK-DIVIDED SEMICONDUCTOR MEMORY DEVICE

BACKGROUND OF THE INVENTION

1. Field of the Invention

The present invention relates to a semiconductor memory device having memory cells divided into a plurality of separate blocks.

2. Description of the Prior Art

In recent years, dynamic metal-oxide semiconductor (MOS) random access memory (RAM) devices have been enlarged to 64 kbits (precisely, 65,536 bits). Thus, as the integration density has become higher, the number of memory cells connected to one sense amplifier for the read operation has become higher and, accordingly, the load on each sense amplifier has also become higher, thus reducing the speed of the read operation. In order to reduce the load on each sense amplifier, a prior art 64 kbits MOS RAM device uses two series of sense amplifiers. That is, the memory cells, sense amplifiers, row address decoders, and the like are divided into two blocks, each with 32 kbits.

Further, as the integration density has become higher, the pitch in the column direction, i.e., the distance between bit lines, has also become smaller, while, column address decoders have become larger due to the increase in the number of address bits. As a result, it has become difficult to arrange one column address decoder for each bit line pair. Therefore, an arrangement has been proposed where one column address decoder is used for every two bit line pairs, four bit line pairs, or the like. In this case, two sense line pairs, four sense line pairs, or the like are provided for each block. Of course, decoders for selecting such sense line pairs are necessary, however, such decoders are separated from the block-divided elements and, accordingly, the presence of such decoders negligibly reduces the integration density.

In a prior art block-divided device in which one column decoder is provided for two or more bit line pairs, i.e., two or more sense line pairs are provided for each block, the arrangement of sense lines is the same in all the blocks. As a result, when a write operation is performed upon a first pair of sense lines, and simultaneously, a read operation is performed upon a second pair of sense lines adjacent to the first pair of sense lines, noise generated by the first pair of sense lines is superposed on each line of the second pair of sense lines due to the capacitance between the adjacent lines, impurity diffusion regions, and the like. As a result, the read operation from the second pair of sense lines may be incorrectly carried out. Note that a read operation carried out simultaneously with a write operation, i.e., a read operation during the write access mode, is a so-called refresh operation. Such a refresh operation is also carried out during the read access mode, and in addition, is independently carried out during a no access mode, i.e., during the refresh mode. Regardless of what mode this prior art device is in, a read operation carried out simultaneously with a write operation can result in excessive noise being applied to the sense lines and an error in the read operation.

SUMMARY OF THE INVENTION

It is an object of the present invention to provide a block-divided semiconductor memory device having two or more sense line pairs provided for each block, in which a correct read operation can be carried out simultaneously with a write operation.

According to the present invention, the arrangement of the sense lines for one block is different from the arrangement of the sense lines for another block. That is, a first pair with a signal line and an inverse line is adjacent to the signal and inverse lines, respectively, of a second pair in one block and the first pair's signal line is adjacent to the inverse line of the second pair, while the second pair's signal line is adjacent to the first pair's inverse line in another block. As a result, noise from the first pair of sense lines applied to each line of the second pair of sense lines is cancelled out.

BRIEF DESCRIPTION OF THE DRAWINGS

The present invention will be more clearly understood from the description as set forth below with reference to the drawings.

FIG. 7 is another block diagram of the embodiment illustrated in FIGS. 1A and 1B.

DESCRIPTION OF THE PREFERRED EMBODIMENTS

Figure 1B:
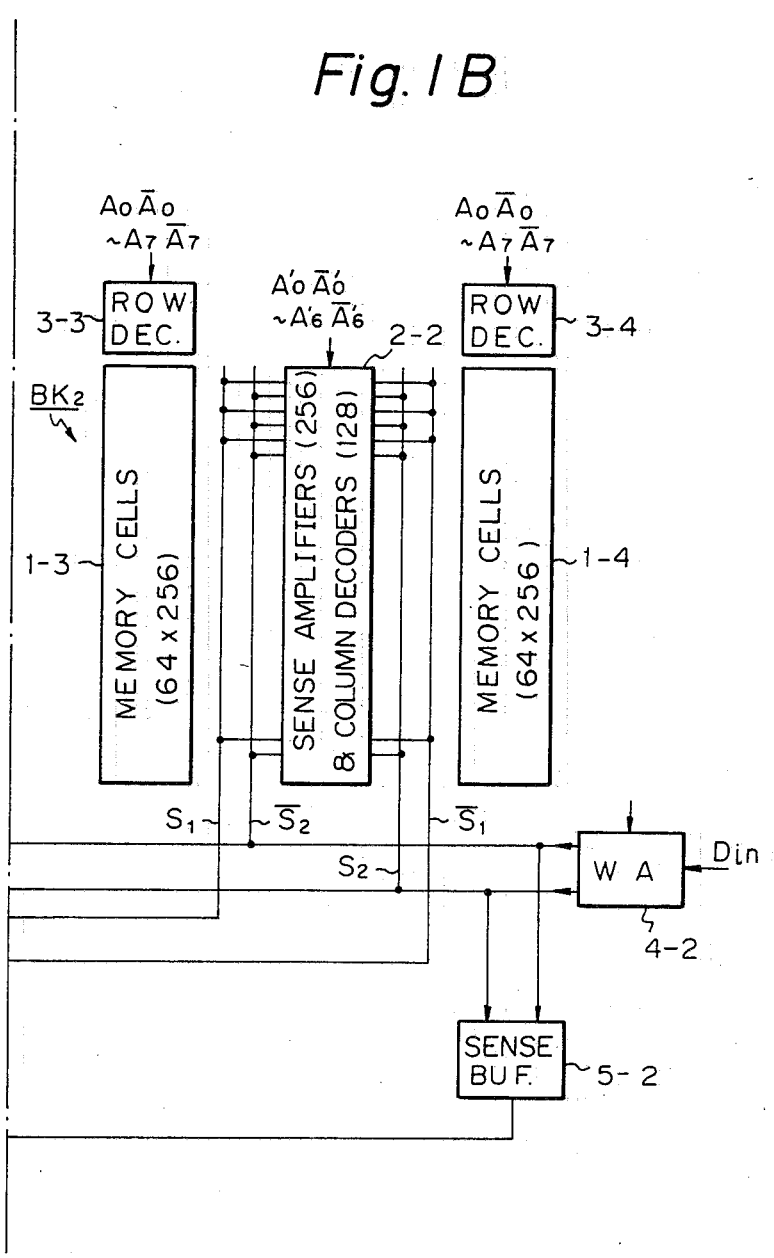
FIG. 1, including 1A and 1B, is a block circuit diagram of a first embodiment of a block-divided semiconductor memory device according to the present invention.

In FIG. 1, which illustrates a first embodiment of the present invention, 64 kbits of memory cells are divided into four 16 kbit memory cell arrays 1-1, 1-2, 1-3, and 1-4. A sense amplifier/column address decoder portion 2-1 is arranged between the memory cell arrays 1-1 and 1-2, and a sense amplifier/column address decoder portion 2-2 is arranged between the memory cell arrays 1-3 and 1-4. Row address decoders 3-1 through 3-4 respond to row address signals $A_0$ and $\overline{A}_0$ through $A_7$ and $\overline{A}_7$ to select one word line from 256 word lines (not shown) within all the memory cell arrays 1-1 through 1-4. Therefore, the memory cell arrays 1-1 and 1-2, the sense amplifier/column address decoder portion 2-1, the row address decoders 3-1 and 3-2, and the like form a first block $BK_1$, while the memory cell arrays 1-3 and 1-4, the sense amplifier/column decoder portion 2-2, the row address decoders 3-3 and 3-4, and the like form a second block $BK_2$. Thus, two series of sense amplifiers are provided, thereby reducing the load thereof.

Figure 2A:
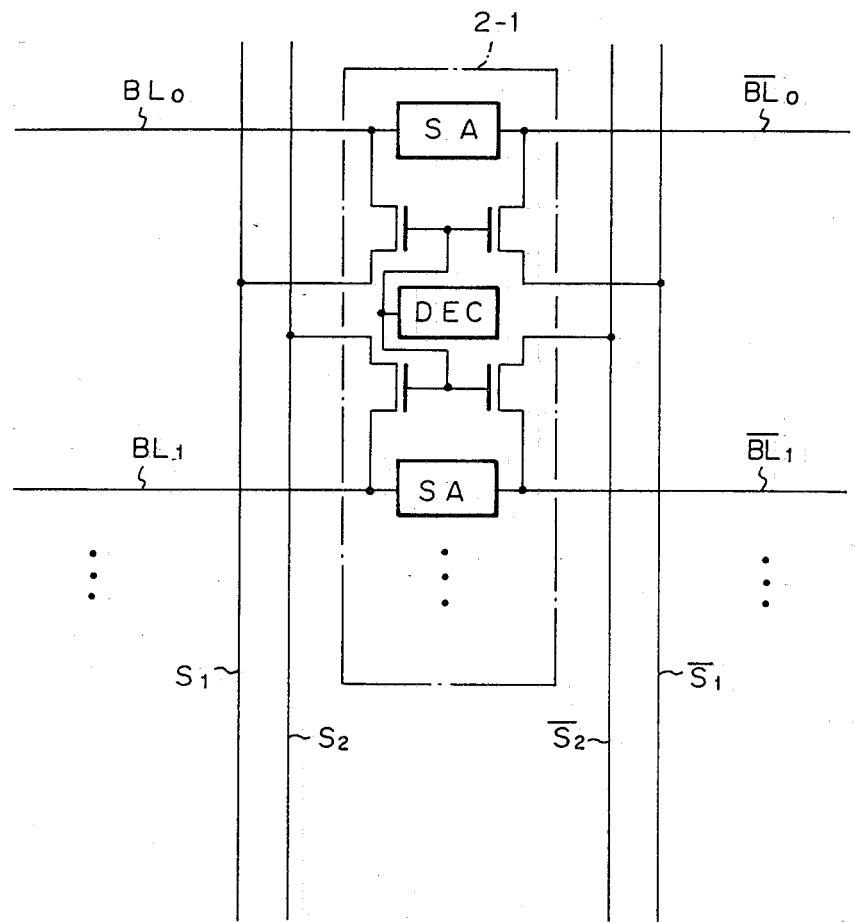
FIGS. 2A and 2B are partial block circuit diagrams of a portion of the diagram of FIG. 1.
Figure 2B:
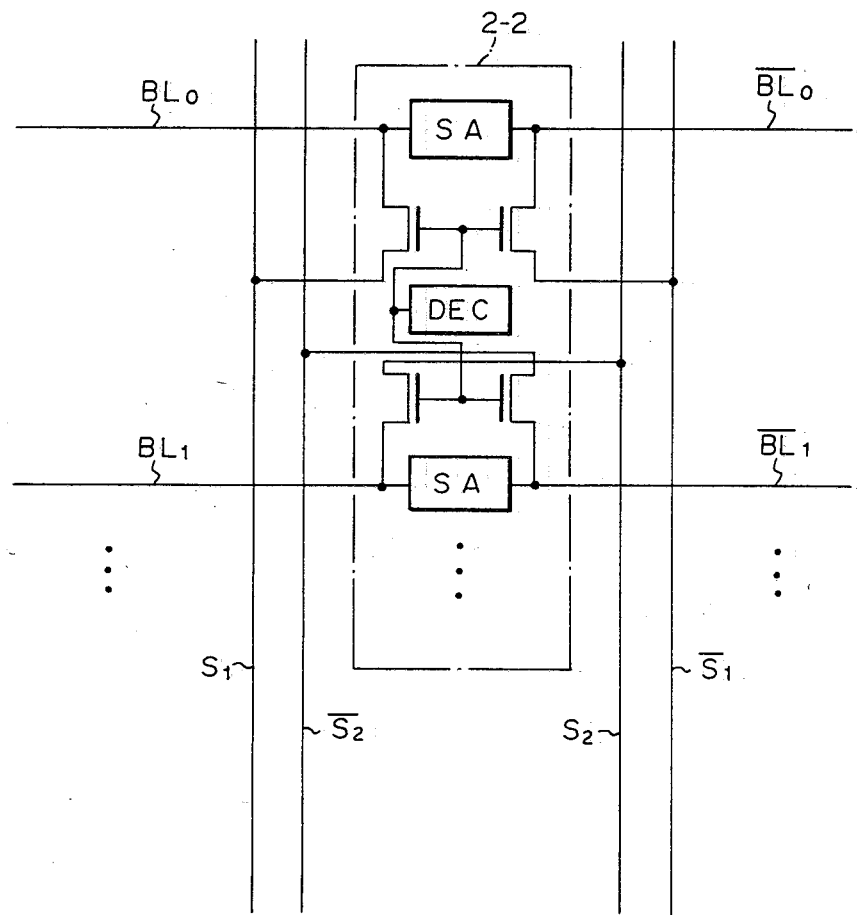

As illustrated in FIG. 2A, the sense amplifier/column decoder portion 2-1 comprises 256 sense amplifiers SA, each provided for one bit line pair, and 128 column address decoders DEC, each provided for two bit line pairs. Similarly, as illustrated in FIG. 2B, the sense amplifier/column decoder portion 2-2 comprises 256 sense amplifiers SA each provided for one bit line pair, and 128 column address decoders DEC each provided for two bit line pairs. The column address decoders DEC respond to column address signals $A_0'$ and $\overline{A}_0'$ through $A_6'$ and $\overline{A}_6'$, to select one bit line pair.

In addition, two pairs of sense lines $S_1$ and $\overline{S}_1$, $S_2$ and $\overline{S}_2$ selected according to column address signals $A_7'$ and $\overline{A}_7'$ are provided for each of the blocks $BK_1$ and $BK_2$. As illustrated in FIGS. 2A and 2B, the sense line $S_1$ (or $\overline{S}_1$) is connected via the portion 2-1 or 2-2 to bit lines $BL_0$, $BL_2$, ..., and $BL_{254}$ (or bit lines $\overline{BL}_0$, $\overline{BL}_2$, ..., and $\overline{BLHD}$ 254), while the sense line $S_2$ (or $\overline{S}_2$) is connected via the portion 2-1 or 2-2 to bit lines $BL_1$, $BL_3$, ..., and $BL_{255}$ (or bit lines $\overline{BL}_1$, $\overline{BL}_3$, ..., and $\overline{BL}_{255}$).

In order to perform a write operation and a read operation upon a memory cell via the first pair of sense lines $S_1$ and $\overline{S}_1$, a write amplifier 4-1 and a sense buffer 5-1 are provided. Similarly, in order to perform a write operation and a read operation upon a memory cell via the second pair of the sense lines $S_2$ and $\overline{S}_2$, a write amplifier 4-2 and a sense buffer 5-2 are provided. The selection of the write amplifiers 4-1 and 4-2 is carried out by a selector 6 using the column address signals $A_7'$ and $\overline{A}_7'$. The selection of the sense buffers 5-1 and 5-2 is carried out by a selector 7 which also uses the column address signals $A_7'$ and $\overline{A}_7'$. Note that reference symbol $D_{in}$ designates an input data signal and $D_{out}$ designates an output data signal.

According to the present invention, the first pair of sense lines $S_1$ and $\overline{S}_1$ are arranged in the same way for each of the blocks $BK_1$ and $BK_2$, while the arrangement of the second pair of sense lines $S_2$ and $\overline{S}_2$ in the block $BK_1$ is different from that in the block $BK_2$.

Therefore, in the sense line $S_2$, the noise generated by the portion of sense line $S_1$ in block $BK_1$ adjacent to a portion of the sense line $S_2$ has a value opposite that of the noise generated by the portion of sense line $\overline{S}_1$ in block $BK_2$ adjacent to the portion of sense line $S_2$ in block $BK_2$, and these noises cancel each other. Similarly, in the sense line $\overline{S}_2$, the noise due to the sense line $\overline{S}_1$ of the block $BK_1$ adjacent to the sense line $\overline{S}_2$ is opposite to the noise due to the sense line $S_1$ of the block $BK_2$ adjacent to the sense line $\overline{S}_2$, and these noises cancel each other. Also, in the sense lines $S_1$ and $\overline{S}_1$, the noises due to the sense lines $S_2$ and $\overline{S}_2$ cancel each other.

Figure 3B:
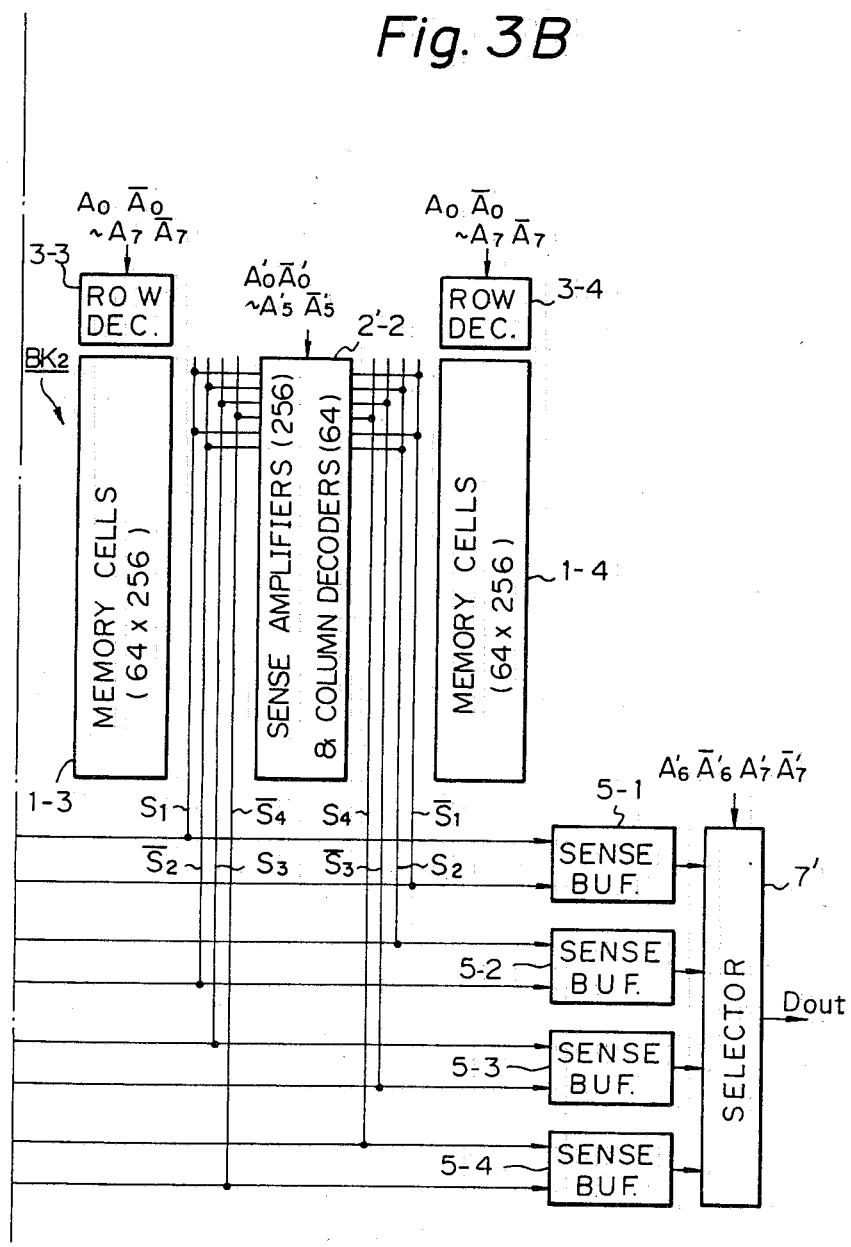
FIG. 3 including 3A and 3B, is a block circuit diagram of a second embodiment of the block-divided semiconductor memory device according to the present invention.
Figure 4A:
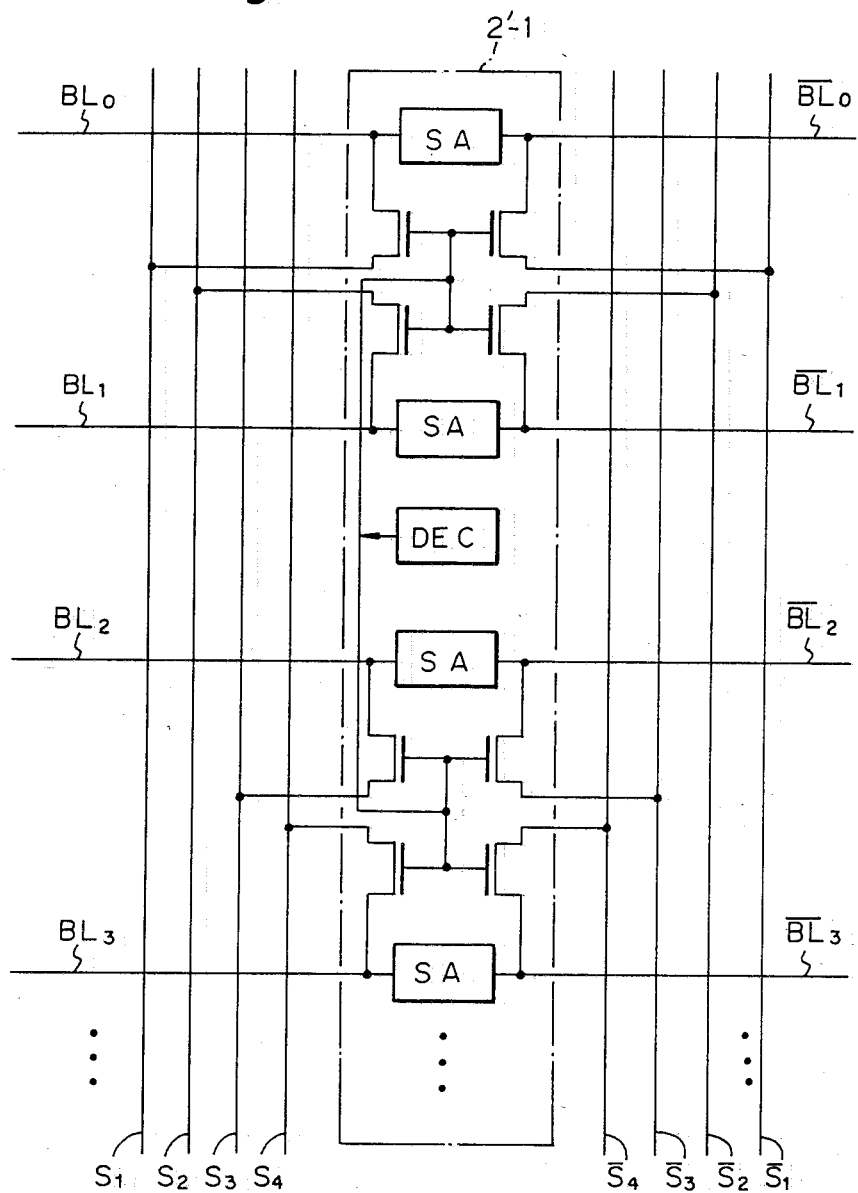
FIGS. 4A and 4B are partial block circuit diagrams of a portion of the diagram of FIG. 3.
Figure 4B:
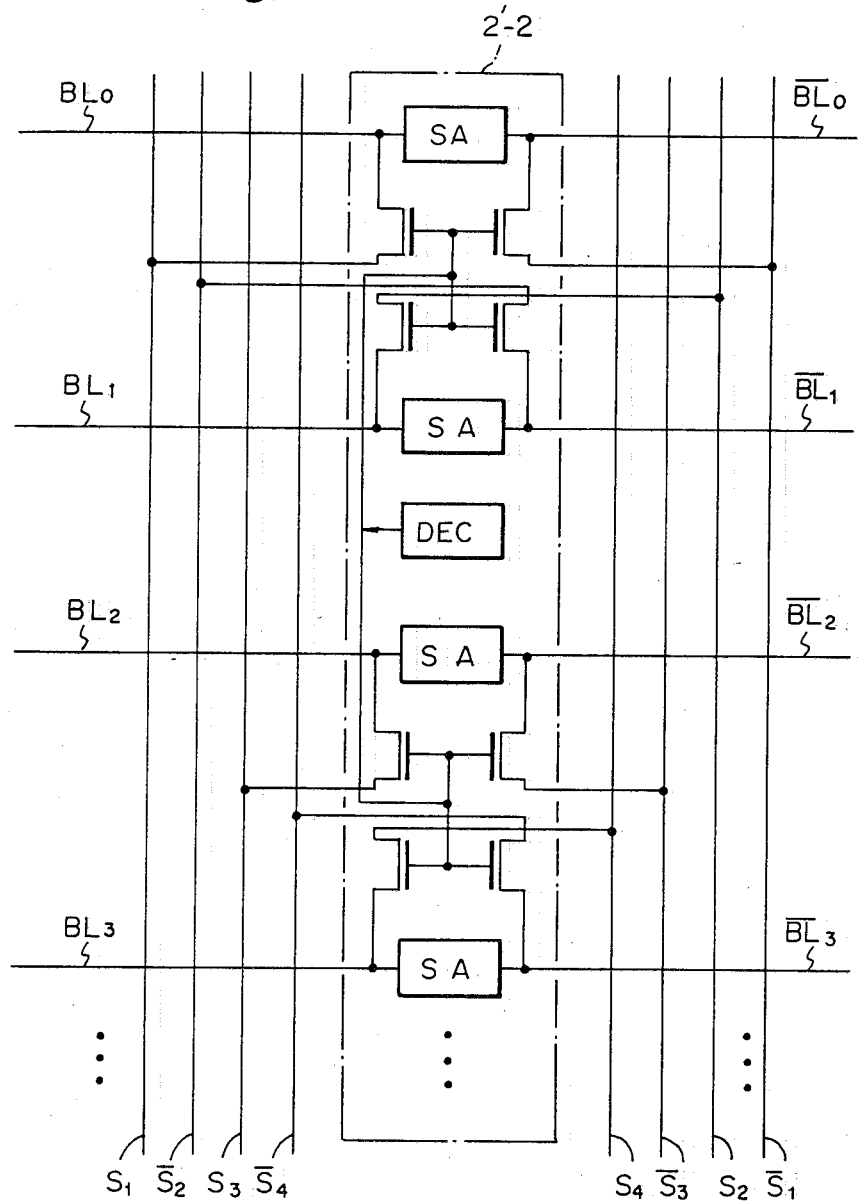

In FIG. 3, which illustrates a second embodiment of the present invention, four pairs of sense lines $S_1$ and $\overline{S}_1$; $S_2$ and $\overline{S}_2$; $S_3$ and $\overline{S}_3$; and $S_4$ and $\overline{S}_4$ are provided. In this case, as illustrated in FIGS. 4A and 4B, the portion 2'-1 (or 2'-2) comprises 64 column address decoders DEC each provided for four pairs of bit lines. In this case, the column address decoders DEC respond to the column address signals $A_0'$ and $\overline{A}_0'$ through $A_5'$ and $\overline{A}_5'$. In addition, two more write amplifiers 4-3 and 4-4 and two more sense buffers 5-3 and 5-4 are added to FIG. 1. A selector 6' responds to the column address signals $A_6'$, $\overline{A}_6'$, $A_7'$, and $\overline{A}_7'$ to select one of the write amplifiers 4-1 through 4-4, and a selector 7' also responds to the column address signals $A_6'$, $\overline{A}_6'$, $A_7'$, and $\overline{A}_7'$ to select one of the sense buffers 5-1 through 5-4.

In the first block $BK_1$ shown in FIG. 3, the sense lines $S_1$, $S_2$, $S_3$, $S_4$, $\overline{S}_4$, $\overline{S}_3$, $\overline{S}_2$, and $\overline{S}_1$ are arranged in that order, while in the second block $BK_2$, the sense lines $S_1$, $\overline{S}_2$, $S_3$, $\overline{S}_4$, $S_4$, $\overline{S}_3$, $S_2$, $\overline{S}_1$ are arranged in that order. Therefore, also in this case, in one sense line such as $S_2$, the noise due to the sense line $S_1$ or $S_3$ in the block $BK_1$ which is adjacent to the sense line $S_2$ cancels the noise due to the sense line $\overline{S}_1$ or $\overline{S}_3$ in the block $BK_2$ which is adjacent to the sense line $S_2$.

Figure 5:
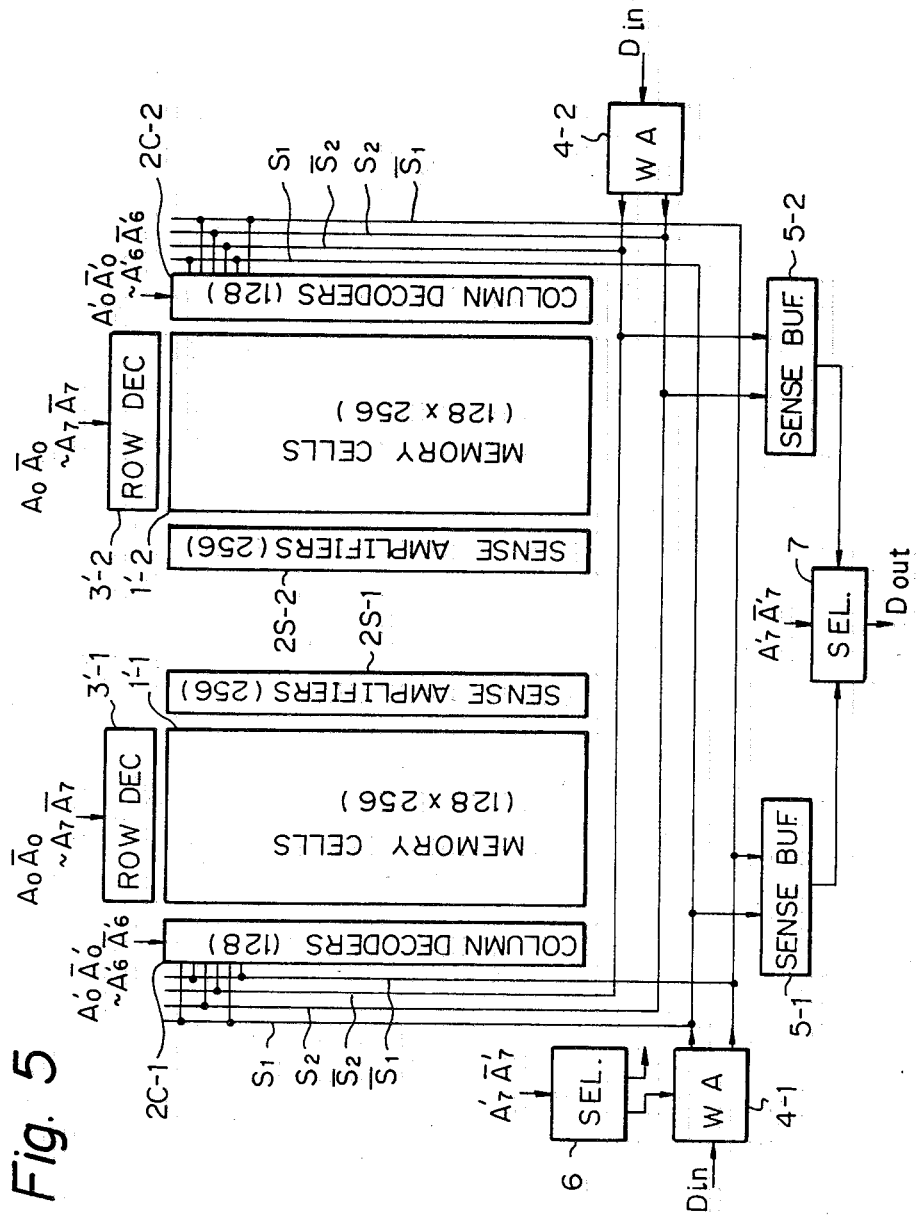
FIG. 5 is a block circuit diagram of a third embodiment of the block-divided semiconductor memory device according to the present invention.
Figure 6A:
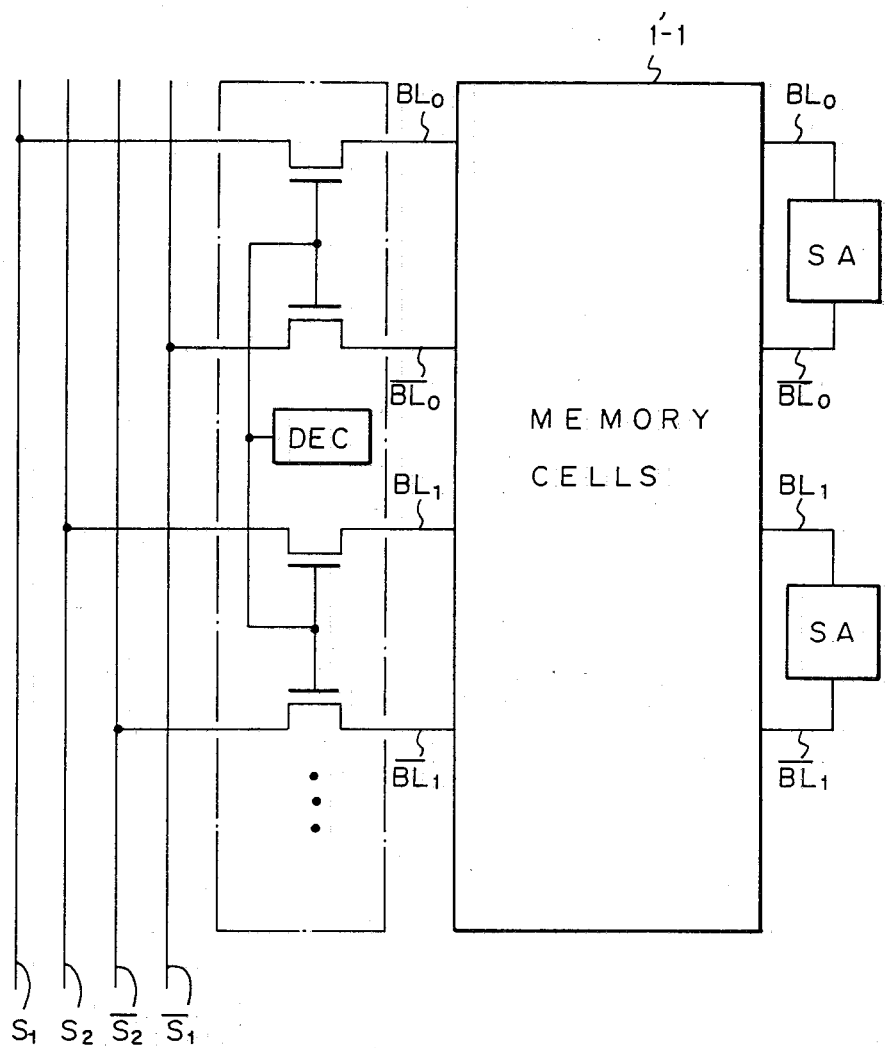
FIGS. 6A and 6B are partial block circuit diagrams of a portion of the diagram of FIG. 5
Figure 6B:
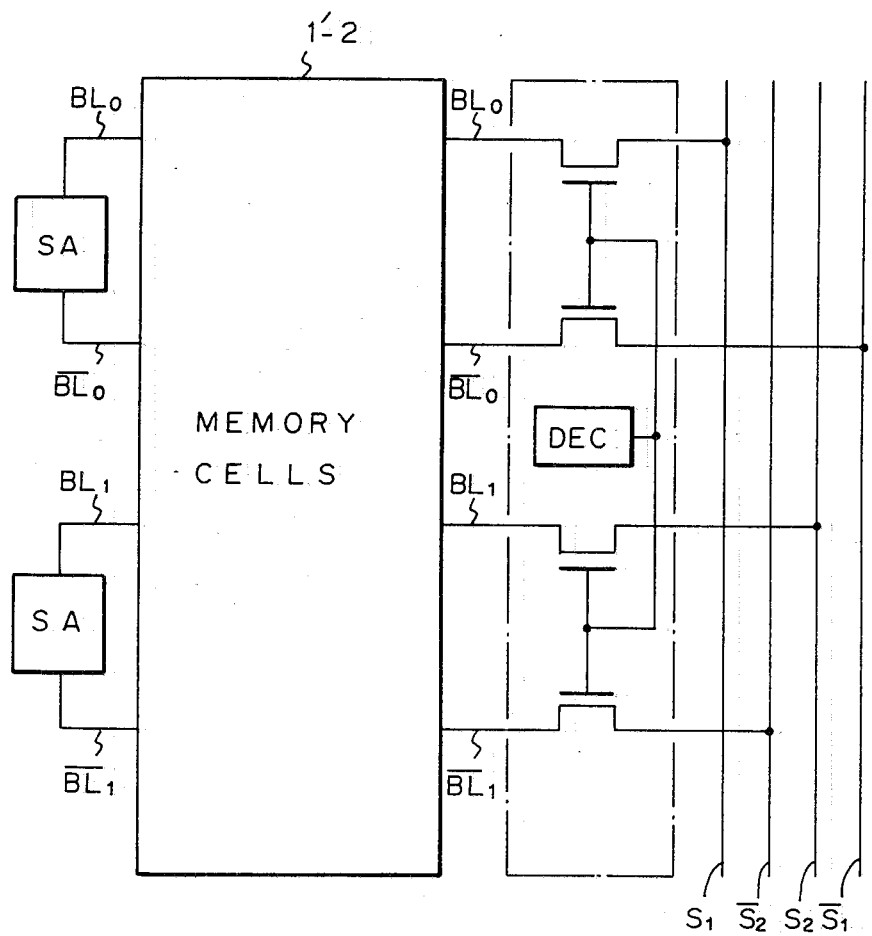

In FIG. 5, which illustrates a third embodiment of the present invention, folded bit lines are arranged on one side of a sense amplifier series, as illustrated in FIGS. 6A and 6B. Note that the embodiments in FIGS. 1 and 3 use opened bit lines arranged on both sides of a sense amplifier series. In FIG. 5, sense amplifiers 2S-1 and column address decoders 2C-1 correspond to the portion 2-1 shown in FIG. 1, and sense amplifiers 2S-2 and column address decoders 2C-2 correspond to the portion 2-2 shown in FIG. 1. In addition, row address decoders 3'-1 correspond to the combination of the decoders 3-1 and 3-2, shown in FIG. 1, and row address decoders 3'-2 correspond to the combination of the decoders 3-3 and 3-4. In this case, the arrangement of the sense lines $S_1$, $\overline{S}_1$, $S_2$, and $\overline{S}_2$ are the same as that in FIG. 1, thereby obtaining the same effect as in the embodiment of FIG. 1.

Note that the present invention can be also applied to the case where memory cells are divided into four or more blocks. For example, in the case of a four-block-divided device having four pairs of sense lines $S_1$ and $\overline{S}_1$; $S_2$ and $\overline{S}_2$; $S_3$ and $\overline{S}_3$; and $S_4$ and $\overline{S}_4$, the sense lines $S_1$, $S_2$, $S_3$, $S_4$, $\overline{S}_3$, $\overline{S}_4$, $\overline{S}_2$, and $\overline{S}_1$ are arranged in this order for two of the blocks, and the sense lines $S_1$, $\overline{S}_2$, $S_3$, $\overline{S}_4$, $S_4$, $\overline{S}_3$, $S_2$, and $\overline{S}_1$ are arranged in this order for the other two blocks.

As explained above, according to the present invention, the noise due to the interaction between the sense lines is reduced, thereby obtaining a correct read operation carried out simultaneously with a write operation.

I claim:

1. A semiconductor memory device, comprising:
   a plurality of word lines;
   a plurality of pairs of bit lines;
   memory cells, operatively connected to said word and bit lines, each provided at an intersection of said word lines and said bit lines, said memory cells being divided into first and second blocks, separated from each other;
   a plurality of pairs of sense lines, each pair comprising first and second adjacent sense lines operatively connected to the first and second blocks of said memory, respectively, each pair of sense lines carrying two complementary signals;
   first selecting means, operatively connected to said word lines, for selecting one of said word lines;
   second selecting means, operatively connected to said bit lines and said sense lines, for selecting pairs of bit lines from said bit lines in each block, to connect the selected pairs of bit lines to said pairs of sense lines for a corresponding block; and
   third selecting means, operatively connected to said pairs of sense lines, for selecting one of said pairs of sense lines, the first adjacent sense lines for the first block of said memory cells having a sense relationship opposite to the second adjacent sense lines for the second block of said memory cells.

2. A semiconductor memory device as set forth in claim 1, wherein said bit lines are of an open type.

3. A semiconductor memory device as set forth in claim 1, wherein said bit lines are of a folded type.

4. A semiconductor memory device, comprising:
   first and second memory cell arrays, having column lines and storage cells therein, each of said first and second memory cell arrays having an equal number of storage cells;

selection means, operatively connected to said first and second memory cell arrays, for selecting one of the storage cells to be accessed; and pairs of sense lines, operatively connected to said first and second memory cell arrays and said selection means, each of said pairs of sense lines carrying a first signal type and a second signal type complementary to the first signal type, said pairs of sense lines comprising:

first portions, operatively connected to the column lines in said first memory cell array, arranged with all of said first portions of said sense lines carrying the first signal type adjacent and all of said first portions of said sense lines carrying the second signal type adjacent; and second portions, operatively connected to the column lines in said second memory cell array, each of said second portions carrying the first and second signal types arranged adjacent to said second portions carrying the second and first signal types, respectively.

5. A semiconductor memory device, comprising:
at least two memory means for storing memory signals;
at least two sense amplifier means, operatively connected to respective memory means, for sensing the contents of said memory means;
input/output means for reading from and writing to said memory means; and
at least two pair of sense amplifier lines, operatively connected to said sense amplifier means and said input/output means, each pair including a first sensing type line and a second sensing type line, where the same sensing type lines are adjacent to each other when connected to one of said at least two sense amplifier means and opposite sensing type lines are adjacent to each other when connected to the other of said at least two sense amplifier means, so that noise coupled between the pairs of said sensing amplifier lines is cancelled out.

* * * * *

UNITED STATES PATENT AND TRADEMARK OFFICE
CERTIFICATE OF CORRECTION

PATENT NO. : 4,596,001

DATED : June 17, 1986

INVENTOR(S) : Fumio Baba

It is certified that error appears in the above-identified patent and that said Letters Patent is hereby corrected as shown below:

Column 3, line 10, "$(\overline{BLHD}254)$," should be $--(\overline{BL}_{254}),--$.

Column 4, line 24, "$\vec{S}_3, \vec{S}_4$," should be $--\vec{S}_4, \vec{S}_3,--$.

Signed and Sealed this
Twenty-fifth Day of November, 1986

Attest:

DONALD J. QUIGG

Attesting Officer

Commissioner of Patents and Trademarks